United States Patent [19]

Gupta et al.

[11] Patent Number: 5,622,595

[45] Date of Patent: Apr. 22, 1997

[54] REDUCING PARTICULATE CONTAMINATION DURING SEMICONDUCTOR DEVICE PROCESSING

[75] Inventors: Anand Gupta; Joseph Lanucha, both of San Jose, Calif.

[73] Assignee: Applied Materials, Inc, Santa Clara, Calif.

[21] Appl. No.: 559,855

[22] Filed: Nov. 20, 1995

Related U.S. Application Data

[63] Continuation of Ser. No. 158,243, Nov. 29, 1993, abandoned, which is a continuation-in-part of Ser. No. 899,539, Jun. 16, 1992, abandoned.

[51] Int. Cl.⁶ .................................................. B44C 1/22
[52] U.S. Cl. ....................... 438/710; 438/935; 438/974; 134/1.2; 134/1
[58] Field of Search .................. 156/635.1, 643.1; 437/926, 939, 946, 949; 148/DIG. 17, DIG. 21, DIG. 22, DIG. 131

[56] References Cited

U.S. PATENT DOCUMENTS

| | | | |
|---|---|---|---|
| 4,871,416 | 10/1989 | Fukuda | 156/635 |
| 4,951,601 | 8/1990 | Maydan et al. | 118/719 |
| 4,985,372 | 1/1991 | Narita | 437/949 |
| 5,043,300 | 8/1991 | Nulman | 437/200 |
| 5,083,865 | 1/1992 | Kinney et al. | 356/338 |
| 5,089,441 | 2/1992 | Moslehi | 437/225 |
| 5,102,496 | 4/1992 | Savas | 156/643 |
| 5,143,866 | 9/1992 | Matsutani | 437/187 |
| 5,328,555 | 7/1994 | Gupta | 156/643 |
| 5,460,691 | 10/1995 | Kobayashi et al. | 437/946 |

FOREIGN PATENT DOCUMENTS

| | | |
|---|---|---|
| 0425419 | 5/1991 | European Pat. Off. . |
| 0453780 | 10/1991 | European Pat. Off. . |
| 60-42831 | 3/1985 | Japan . |
| 61-196538 | 8/1986 | Japan . |
| 63-1035 | 1/1988 | Japan . |

OTHER PUBLICATIONS

Selwyn et al, "In-situ particulate contamination . . . " SPIE Conf. Proc. Oct., 1989.

Selwyn, "Laser diagnostic techniques . . . " J. Vac. Sci. Technol. A 6 (3) May/Jun. 1988.

"IBM reveals Design for Self Cleaning Tools" Semiconductor International, Sep. 1991 p. 46.

IBM Technical Disclosure Bull. vol. 34, No. 11, pp. 237–238, Apr. 1992.

*Primary Examiner*—Chandra Chaudhari
*Attorney, Agent, or Firm*—Birgit E. Morris; Raymond Kwong

[57] ABSTRACT

Contaminant particles in a vacuum plasma processing chamber can be removed from the surface of a substrate in the chamber by first reducing the pressure in the chamber so as to elevate the particles above any obstruction about the substrate, including a clamping ring and the like, maintaining a plasma from a gas fed to the chamber so that the particles are in the plasma, and then increasing the gas flow to the chamber so as to sweep the particles out of the chamber through the exhaust system of the processing chamber while maintaining a plasma in the chamber.

13 Claims, 1 Drawing Sheet

REDUCING PARTICULATE CONTAMINATION DURING SEMICONDUCTOR DEVICE PROCESSING

CROSS REFERENCES TO RELATED APPLICATIONS

This is a continuation of U.S. application Ser. No. 08/158,243 filed Nov. 29, 1993, which is a continuation-in-part of Ser. No. 07/899,539 filed Jun. 16, 1992, both applications now abandoned.

This invention relates to removal of particulate contaminants during semiconductor processing. More particularly, this invention relates to a method for removing contaminant particles present in a plasma reactor.

BACKGROUND OF THE INVENTION

In the manufacture of microelectronic devices, particularly VLSI and ULSI devices, in which the overall dimensions of devices are becoming bigger and more closely packed, and the critical dimensions are becoming much smaller, particle contamination is of increasing concern. The presence of particles during deposition or etching of thin films can cause voids, dislocations or shorts which adversely affect performance and reliability of the devices.

The problem of contaminant particles was addressed initially by improving the quality of clean rooms and improving automated equipment to handle materials and semiconductor substrates, e.g., silicon wafers. Improved cleaning of wafer surfaces was also addressed. These improvements have greatly reduced the number of particles that are present or fall onto a wafer surface during the processing cycle. However, many particles are generated inside the wafer processing chambers themselves due to the materials used for processing and due to mechanical means, for example the rubbing movements of robotic equipment during transfer operations and the like.

In particular during processing that uses a plasma, many fragments of various kinds are generated from the processing gases, including ions, electrons, particles, and the like. The fragments can combine to form generally slightly negatively charged particles, i.e., on the order of $10^4$ negative charge. In addition, the processing chamber becomes coated with various materials, such as polymers, during plasma processing of a wafer. Stress, such as stress due to thermal cycling and the like, causes these films to fracture and dislodge from the walls and surfaces on which they have deposited, also generating particles. In addition, particles are generated within the processing chambers during wafer transfer operations, pump oil backstreaming and the like.

Selwyn et al have disclosed one solution to avoiding deposition of particles onto a wafer. They redesigned the wafer support electrode to provide grooves therein which provide a disturbance around the periphery of the wafer, and beyond the wafer surface. This attracts particles to this disturbed region beyond the wafer so that the vacuum chamber exhaust system can carry particles away from the wafer and outside of the processing system. While a reduction of particles of up to 70% is said to be obtained, it does require redesign of wafer support electrodes and retrofitting of existing equipment, which is expensive.

Selwyn et al have also suggested that during plasma processing particles form and collect at the plasma/sheath boundary. At the end of plasma processing when the RF power is shut off, these particles fall onto the wafer. They further teach that this is a major source of particulate contamination of wafer surfaces in a plasma chamber. They suggested that the number of particles be reduced by turning off the RF power slowly, so that particles are released from the sheath region more slowly, so that they may be evacuated by the chamber exhaust system rather than drop onto the wafer. This solution however is uncontrollable at best.

It would be highly desirable to develop a reliable, inexpensive process to remove particles from wafer plasma processing chambers.

SUMMARY OF THE INVENTION

Particles formed during plasma processing, or dislodged during plasma processing, can be removed from a reaction chamber at the end of plasma processing by a process comprising reducing the pressure inside the plasma chamber, and at the same time also increasing the flow of a gas to the chamber, but without increasing the pressure in the chamber. The particles are lifted above the surface of the substrate into the plasma and are swept by the gas stream to the exhaust system of the reactor. Power to the chamber is maintained during this reduced pressure/increased gas flow step at a level that will maintain a plasma from the gas.

DETAILED DESCRIPTION OF THE INVENTION

Figure 1:
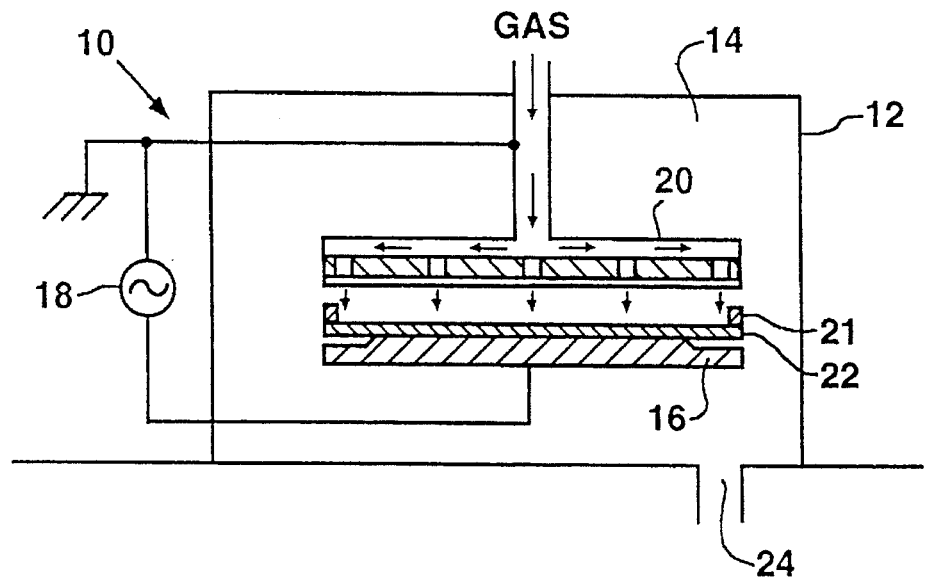
FIG. 1 is a cross sectional view of a conventional etch chamber.

Processes such as plasma etching are generally carried out at low pressures, e.g., about 50 millitorr, using a stream of etchant and carrier gases such as argon or other inert gas, which inert gas is fed to the reactor at about 30–35 sccm. Plasma enhanced chemical vapor deposition also employs reduced pressures and reactive and carrier gases, generally at somewhat higher chamber pressures. In accordance with the invention, after processing is complete, the pressure in the chamber is reduced to about 15–40 millitorr while maintaining a plasma. This reduction in pressure is sufficient to lift particles which have deposited on the wafer above the surface of any obstructions in the chamber surrounding the substrate being processed, e.g., a silicon wafer, such as a clamping ring, focussing ring or clamping fingers which keep the wafer in contact with its support, and to maintain the lifted particles in the plasma region.

At the same time the pressure is reduced, the flow of argon or other reactive or inert gas is increased to about 100–145 sccm, or the maximum flow rate that can be used in the particular chamber being utilized without markedly increasing the pressure in the chamber. This increased gas flow rate sweeps the elevated, loosened particles out of the chamber into the exhaust system of the processing chamber. This may require independent gas flow control and good control of the exhaust gas system. Some type of exhaust gas throttling may also need to be provided, depending upon the particular plasma chamber employed, as will be known to one skilled in the art.

The process of the invention can also be carried out prior to plasma processing. For example when a plasma process is to be carried out in a chamber, the pressure is reduced to a low level as discussed above, and inert or one or more process gases fed to the chamber at a comparatively high rate, to lift and remove any particles that are on the surface of the chamber.

The gases fed to the chamber during the particle removing step can be either etch, physical vapor deposition gases or chemical vapor deposition gases, including chlorine, nitrogen, oxygen, silicon hexafluoride, nitrogen trifluoride, nitrous oxide, and the like, to name a few. Inert gases such as argon or helium can also be passed into the chamber at this point, either alone or together with one or more reactive gases.

When reactive gases are used to remove particles, the power should be kept low so that actual reaction of the gases and the wafer surface is minimized. Of course the power must be sufficient to maintain a plasma in the chamber from the gases. Suitably, a power of about 50 watts is sufficient to maintain a plasma at very low pressures in the chamber. Using reactive gases at low power and low pressure and high gas flow rates for about 5 seconds will be sufficient to lift particles from the surface of the wafer and carry the particles in the gas stream to the chamber exhaust system.

When inert gases are employed herein, the power can be somewhat higher since there is no danger of reaction between the inert gases and the surface of the wafer.

Selwyn et al have disclosed an optical system for monitoring particles inside a chamber as will be further described hereinbelow with reference to FIG. 2.

The above process for removing particles can be employed during plasma processing of any type, e.g., during plasma etching, sputtering, PECVD and the like. The present process is particularly advantageous for present-day multichamber equipment whereby various processing chambers, including PECVD and plasma etch chambers, communicate by means of a central load lock chamber. In such apparatus, described for example in U.S. Pat. No. 4,951,601 to Maydan et al, a wafer is automatically transferred into a central load lock chamber containing robotic equipment for transferring a wafer to various processing chambers connected to the load lock chamber. If the wafer is to be transferred to a PECVD chamber, the wafer is robotically transferred from the central load lock chamber to a PECVD chamber for processing. When this processing step is completed, the wafer is robotically transferred back to the central load lock chamber. If the wafer is to be treated in a subsequent, different step, e.g., heat treated or etched, the conditions in the central load lock chamber are adjusted if required, the wafer is robotically transferred to the next processing chamber, and so forth. It will be readily apparent that the generation of particles within the whole system should be kept as low as possible, and that any loose particles on the surface of the wafer deposited at any step of the processing sequence, should be removed as much as possible prior to transferring the wafer to the next chamber. Otherwise in time the number of particles in the system builds up and eventually the system must be disassembled for cleaning. This of course greatly increases the downtime of the equipment and adds to the costs of processing a wafer. Thus the present method of removing particles can be utilized several times during the course of processing a wafer, and can be carried out before and after the processing in any one chamber.

A conventional etch chamber is shown in FIG. 1 and is described below. Referring to FIG. 1, an etch reactor 10 comprises a housing 12, typically made of a non-magnetic material such as aluminum, defines an etch chamber 14. A cathode 16 for supporting the wafer to be processed is connected to a source 18 of RF energy. Processing gases are supplied to the chamber 14 via a gas manifold 20. The gas manifold 20 is positioned over and closely spaced to the cathode 16. A wafer 22 to be processed is positioned on the cathode support 16 and affixed to the cathode by means of a clamping ring 20. An exhaust line 24, connected to a vacuum pump (not shown) continually evacuates the chamber 14. In operation, the gas supply is started and the RF power is turned on, when a plasma forms in the space between the gas manifold 20 and the wafer 22.

An etch chamber having a wafer transfer system that reduces the generation of particles is described in U.S. Pat. No. 4,951,601. However, I have found that particles are nevertheless generated in the plasma, either through a combination of various plasma species or because of flaking of deposited material on the walls and other surfaces of the chamber.

Figure 2:
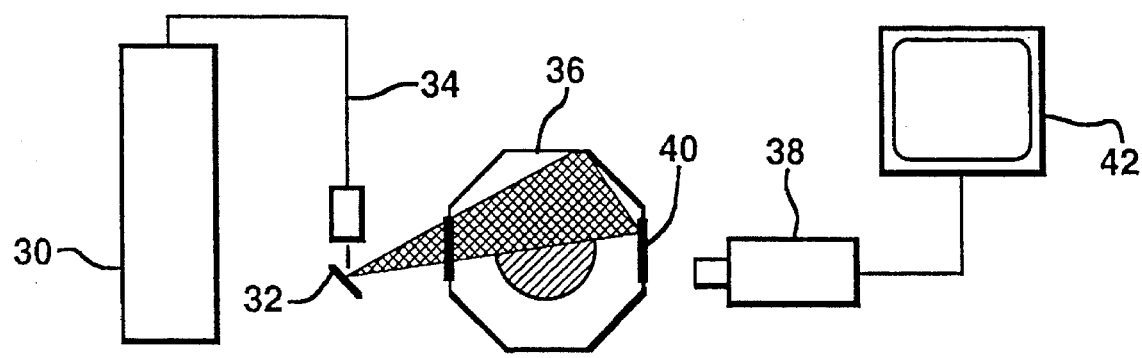
FIG. 2 is a schematic diagram of a laser light scattering system useful herein.

FIG. 2 is a schematic diagram of a laser light scattering system useful for the observation of particles and their behavior within a plasma etch system.

Referring to FIG. 2, an argon laser 30 is connected to a scanner 32 by means of a fiber optic cable 34. Suitably the laser is a 5W water cooled multiple line argon laser coupled to a fiberoptic cable. This cable can be mounted in a laser holder attached to a vertical shaft supported on a rotational base. Other lasers can also be used however. The scanner 32, a galvanometer, is mounted on a custom holder attached to an adjustable vertical stage. The laser and the scanner slide on an optical rail situate parallel to the chamber viewport. This arrangement provides X, Y and Z motion and adjustment of the laser. The consistency of the light plane is controlled by a frequency generator input of 0.1 Hz to about 500 Hz. The amount of oscillation (the angle of rotation) can be varied by an input amplitude voltage up to one volt. A DC offset controls the starting position of the angle of rotation. The scanner 32 accesses the interior of an etch chamber 36. A three chip CCD high resolution RGB video camera 38 is mounted on an angular adjustable platform attached to a vertical shaft that slides on an optical rail. The camera has access to the interior of the etch chamber 36 by means of a window 40 in the wall of the chamber. The camera 38 is set up to provide various focal lengths by adjustment of the viewing distance from the window 40 to the camera 38. The video camera 38 is connected to a TV monitor 42 for viewing the particles inside the chamber 36.

The above system was set up so that the focus distance between the end of the fiber optic laser source and the scanner was approximately 3–4 inches on a 12.5 mm round mirror, oscillating at 300 Hz. The laser intensity was 1.75w at a wavelength of 514.5 nm. The beam was projected through the chamber window and terminated on the interior chamber wall at 45 degrees from the point of entry. The beam had a divergence of about one inch and a length of 4–6 inches from the slit valve entry to the exit viewport. The TV camera was set so that it had a view through the exit window and was focused on the edge of the wafer nearest the slit valve. It had a slight downward angle that provided a view just inside of the wafer clamping ring. The distance from the camera to the edge of the wafer was about 12–13 inches.

The following examples demonstrate the invention. Although the examples are described in terms of specific embodiments, one skilled in the art will know how to vary them and still obtain similar results and the invention is not meant to be limited to the details described herein.

EXAMPLE 1

Using the above described argon laser system of FIG. 2 at a power of about 100–200 W and scanning frequencies of from 10 Hz to 300 Hz, the pressure in a plasma chamber containing a silicon wafer was set at about 50–700 millitorr. A flow of argon was started varying from about 20–75 sccm. While observing the plasma region, various parameters were changed so as to observe the shape and thickness of the plasma sheath region within the chamber. A change in the position of the boundary sheath was noted with change in pressure; as the pressure was increased from 50 millitorr to 700 millitorr, the glow region increased and the boundary sheath region decreased. We also observed that the plasma/boundary sheath was well-shaped, and followed the contour of the clamping ring for the wafer. At 50 millitorr the sheath was about 0.5 inch thick. When the clamping ring was removed, the shape of the boundary sheath was that of a dome. Particle light scattering was noted at 200W and 50 millitorr pressure using a gas flow of 25 sccm of argon after about one second using 1.75 W laser intensity.

When the chamber was doped with alumina particles, the particles hovered about 0.5 inch above the surface of the wafer and at the interface of the wafer and the clamping ring. The particles ranged in size from about 1.6–3.0 microns. When the RF power was turned off, the particles appeared to fall back onto the wafer.

EXAMPLE 2

Using a tungsten etch chamber as in FIG. 1, a blanket tungsten layer over a TiN layer on a silicon wafer was reactive ion etched. At the end of etch processing, without turning the RF power off, the pressure was reduced to 30–40 millitorr, the RF power was maintained at 200 W and argon flow was increased to about 130 sccm.

A large number of particles were observed in the exhaust line of the chamber using an in-situ particle monitor described in U.S. Pat. No. 5,083,865 after adjustment of pressure and argon flow, leading to the conclusion that extra particles trapped in the plasma were being exhausted along with argon gas.

EXAMPLE 3

An etch chamber was doped with alumina particles about 1.6–3.0 microns in diameter in size. The RF power was turned on and a flow of argon started. A plasma was formed. Initially these particles were observed to be trapped in the plasma/sheath boundary region. The number of particles being exhausted by the etch chamber can be monitored by a particle monitor system as described in U.S. Pat. No. 5,083,865 to Kinney et al, incorporated herein by reference. By maintaining a low pressure of about 25 millitorr, and increasing the flow of argon from about 25 sccm to about 145 sccm, the particles were cleared from the plasma/sheath boundary region in which they were trapped. At the end of this step, no alumina particles were observed within the plasma/sheath boundary region by laser light scattering.

Although the invention has been described in terms of processing a wafer, it will be understood that various other substrates can be employed herein. Further, although the process has been applied to removing particles after plasma processing, the process is equally applicable to removing particles from the surface of a wafer prior to plasma processing. The method is independent of the particular plasma apparatus employed and is applicable to removing particles in any type of plasma chamber.

The present invention has been described by means of specific embodiments and processes. However, one skilled in the art can readily vary the equipment and parameters, such as power, described, as well as the gases, time, and the like, and the invention is meant to be limited only by the scope of the attached claims.

I claim:

1. A method of removing particles from the surface of a substrate mounted in a plasma processing vacuum chamber comprising a) reducing the pressure in the chamber while maintaining a plasma of a gas stream in the chamber so that the particles are elevated above any obstructions near the substrate being processed; and b) increasing the flow of the gas stream to carry the elevated particles in the gas stream away from the surface of the substrate.

2. A method according to claim 1 wherein the process is an etch process and the gas is argon.

3. A method according to claim 1 wherein the pressure in step a) is reduced to about 15 to 40 millitorr.

4. A method according to claim 1 wherein the gas flow is increased to about 100 to about 145 sccm.

5. A method according to claim 2 wherein the argon flow is increased to about 120 to about 135 sccm.

6. A method for removing particles generated in a vacuum plasma reactor chamber having a plasma sheath region and a vacuum exhaust system during plasma processing of a substrate comprising:

a) maintaining a plasma of an inert gas in said chamber;

b) reducing the pressure in said chamber to elevate said particles to the plasma sheath region and away from the surface of said substrate; and c) increasing the flow of the inert gas without increasing the pressure in the chamber, thereby sweeping said particles in said inert gas stream into the vacuum chamber exhaust system.

7. A method according to claim 6 wherein said plasma is generated by an RF power source.

8. A method according to claim 6 wherein said pressure is reduced to from about 15–40 millitorr.

9. A method according to claim 6 wherein said inert gas flow is increased to about 100–145 sccm.

10. A method according to claim 6 wherein said inert gas is argon and said gas flow is increased to about 120–135 sccm.

11. A method of removing particles from the surface of a substrate mounted in a vacuum plasma processing chamber having a source of power and a gas inlet connected thereto which comprises a) reducing the pressure in the chamber while maintaining a plasma from a gas stream supplied through said gas inlet in said chamber above the surface of the substrate so as to lift particles on the surface of the substrate into the plasma region; and b) increasing the gas flow rate of said gas stream so as to carry said elevated particles away from the substrate.

12. A method according to claim 11 wherein said gas is selected from the group consisting of an inert gas, a processing gas and a mixture of an inert gas and a processing gas.

13. A method according to claim 11 wherein said gas is a processing gas and said power is reduced so that no reaction takes place on the surface of the substrate during lifting of the particles.

* * * * *